United States Patent
Furukawa et al.

(10) Patent No.: US 6,872,285 B2
(45) Date of Patent: Mar. 29, 2005

(54) SYSTEM FOR DEPOSITING A FILM

(75) Inventors: Shinji Furukawa, Fuchu (JP); Miho Sakai, Fuchu (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/233,272

(22) Filed: Aug. 30, 2002

(65) Prior Publication Data

US 2003/0062260 A1 Apr. 3, 2003

(30) Foreign Application Priority Data

Aug. 30, 2001 (JP) ........................................ 2001-262108

(51) Int. Cl.[7] ............................................. C23C 14/35
(52) U.S. Cl. ............................. 204/192.2; 204/192.15; 204/298.11; 204/298.18
(58) Field of Search ..................... 204/192.15, 192.2, 204/298.11, 298.18, 298.23, 298.26

(56) References Cited

U.S. PATENT DOCUMENTS

| | | | | |
|---|---|---|---|---|
| 5,087,482 A | * | 2/1992 | Kawai et al. ................ | 427/129 |
| 6,068,742 A | * | 5/2000 | Daxinger et al. ...... | 204/298.09 |
| 6,328,856 B1 | * | 12/2001 | Brucker ................. | 204/192.12 |
| 6,461,484 B2 | | 10/2002 | Yo et al. ................ | 204/192.12 |
| 6,730,197 B2 | * | 5/2004 | Wang et al. ........... | 204/298.11 |

FOREIGN PATENT DOCUMENTS

| | | |
|---|---|---|
| JP | 59-215045 | * 12/1984 |
| JP | 05-320893 | 12/1993 |
| JP | 10-036963 | 2/1998 |
| JP | 10-121234 | 5/1998 |
| JP | 10-168567 | 6/1998 |

* cited by examiner

*Primary Examiner*—Rodney G. McDonald
(74) *Attorney, Agent, or Firm*—Hogan & Hartson, LLP

(57) ABSTRACT

This application discloses a system for depositing a magnetic film for a magnetic recording layer or depositing an underlying film prior to depositing a magnetic film as a recording layer. The system comprises; a chamber in which the film is deposited onto a substrate by sputtering, a target that is provided in the chamber and made of material of the film to be deposited, a sputter power source for applying voltage to the target for the sputtering, and a direction control member for controlling sputter-particles released from the target during the sputtering. The direction control member is provided between the substrate and the target. The direction control member provides a passage for the sputter-particles. The direction control member lets the sputter-particles selectively pass through, thereby allowing magnetic anisotropy to the magnetic film. The passage is not close but open in its cross section.

11 Claims, 11 Drawing Sheets

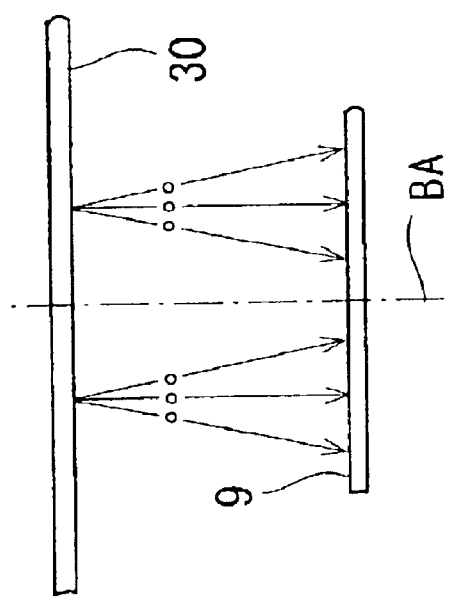
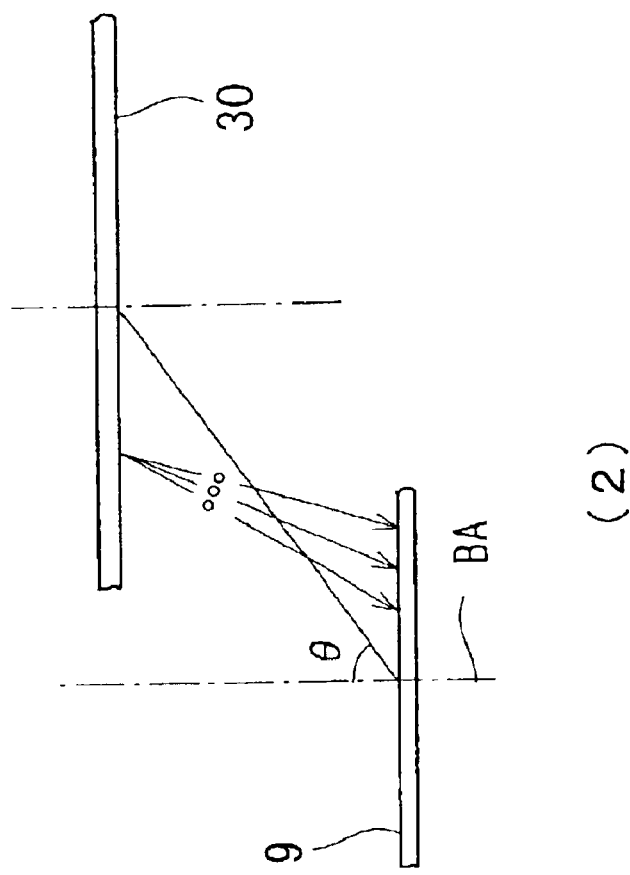
FIG.9

SYSTEM FOR DEPOSITING A FILM

BACKGROUND OF THE INVENTION

This invention relates to thin-film deposition, which is widely practical in manufacturing products such as magnetic recording disks. Magnetic recording disks such as hard-disks and flexible disks are widely used as storage media in computers. Magnetic recording disks have basic structures where magnetic recording layers are provided on disk-shaped substrates.

Manufacture of a magnetic recording disk will be described as follows, taking a hard-disk as an example. Conventionally, a substrate made of aluminum is employed in manufacturing a hard-disk. A NiP (nickel phosphide) film is deposited on the substrate. On the NiP film, such an underlying film as a CoCr film is deposited. On the underlying film, such a magnetic film as a CoCrTa film is deposited for the magnetic recording layer. On the magnetic film, a carbon film having a structure similar to diamond, which is called "diamond-like-carbon (DLC) film", is deposited as a protection layer called "overcoat".

In manufacture of magnetic recording disks, several limitations are foreseen from the point of view of increasing recording density. Recent recording density in magnetic recording disks has been soaring remarkably. Currently it is reaching 35 gigabit/inch$^2$, supposedly 100 gigabit/inch$^2$ in the future. For higher recording density, it is necessary to make magnetic domains shorter and track width narrower in the longitudinal recording that is generally adopted. For making magnetic domains shorter and track width narrower, it is required to reduce distance between a magnetic head, which is for write-and-readout of information, and a magnetic recording layer. This distance is often called "spacing" in this field. The length of each magnetic domain is often called "bit length". If spacing is wider at shorter bit length and narrower track width, write-and-readout errors may take place because magnetic flux cannot be captured sufficiently by the magnetic head.

Factor of magnetization-transition region is also important in increasing recording density. In the longitudinal recording, magnetic domains are magnetized alternatively to opposite directions along a track. Each boundary of the magnetic domains does not demonstrate clear linearity within width of the track. This is because the magnetic film is collectively made of fine crystal grains. Each boundary is formed with outlines of crystal grains. Therefore, each boundary is zigzag-shaped. Each boundary of magnetic domains is called "magnetization-transition region" because it is the place where magnetization is inverted. Because each boundary is zigzag-shaped, magnetization transition averaged in track width tends to be not steep but gentle. This means magnetization-transition region is wide. When magnetization-transition region becomes wider, the number of the magnetic domains capable of being provided in limited length of a track becomes smaller. Therefore, the factor of magnetization-transition region lies as a bottleneck in enhancing recording density.

To narrow magnetization transition region, it is required to deposit a magnetic film of smaller crystal grains. For making grains smaller, to make a magnetic film thinner is one solution. However, when grains are made smaller, the problem of thermal decay of magnetization becomes more serious. This point will be described as follows. When a magnetic domain is magnetized, theoretically the magnetization is sustained unless the inverse magnetic field is applied to it. Practically, however, the magnetization is dissolved slightly and slightly from the thermal decay as time passes. Therefore, permanent sustenance of the magnetization is impossible unless the magnetic domains are cooled at the absolute zero temperature. If the problem of the thermal decay appears extremely, recorded information may vanish partially after several years have passed. Such the result is greatly serious in case that the magnetic recording disk is used for semi-permanent information storage.

The thermal decay is the phenomenon of the thermal magnetic relaxation that magnetized particles are magnetized inversely from their thermal oscillation. Particularly, magnetized particles adjacent to a magnetization-transition region have high possibility of the thermal relaxation, i.e. the inverse magnetization, from influence of the inverse field by a neighboring magnetic domain. In magnetic films for magnetic recording, such the thermal decay may take place easily when the grains are made smaller, because each grain becomes thermally unstable. Therefore, unless the problem of the thermal decay is solved, to make magnetization-transition steeper by making grains smaller may suffer difficulty.

SUMMARY OF THE INVENTION

An advantage of this application of the invention is to solve the above-described problems. For this advantage, the invention presents a unique system capable of allowing magnetic anisotropy to a magnetic film. Concretely, the system of the invention includes a chamber in which a film is deposited onto a substrate by sputtering, a target that is provided in the chamber and made of material of the thin film to be deposited, a sputter power source for applying a voltage to the target for the sputtering, and a direction control member for controlling sputter-particles released from the target during the sputtering. The direction control member is provided between the substrate and the target. The direction control member provides a passage for the sputter-particles, and lets the sputter-particles selectively pass through, thereby allowing the magnetic anisotropy to the magnetic film.

BRIEF DESCRIPTION OF DRAWINGS

FIG. 9 is a schematic view to show the technical advantage brought by the eccentric layout of the target 30 and the substrate 9.

DETAILED DESCRIPTION OF THE PREFERRED EMBODIMENTS

Figure 1:
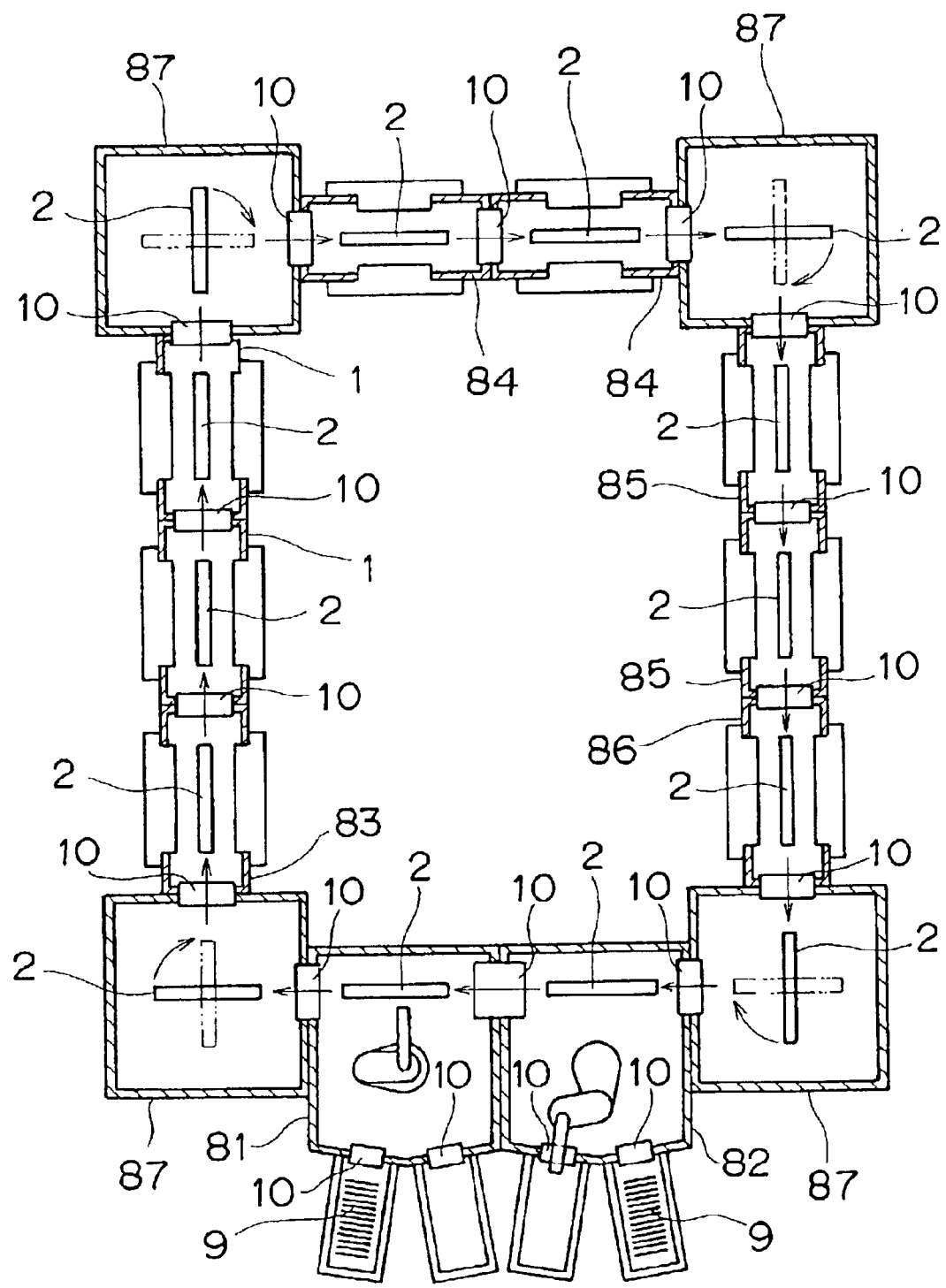
FIG. 1 is a schematic plane view of a system as one of the preferred embodiments of the invention.

The preferred embodiments of the invention will be described in detail as follows. The systems described as follows are supposed to be used in manufacturing magnetic recording disks. FIG. 1 is a schematic plane view of a system as one of the preferred embodiments of the invention.

The system shown in FIG. 1 is one of inline-type systems. The "inline type" is the general term for systems where a plurality of chambers are provided in a line, and a transfer path of substrates is provided through the chambers. In the system of this embodiment, a plurality of chambers 1, 81, 82, 83, 84, 85, 86, 87 are aligned along a rectangular loop, through which a transfer path is provided.

Each chamber 1, 81, 82, 83, 84, 85, 86, 87 is a vacuum chamber that is pumped through its own or a common pumping line. A gate valve 10 is provided at each boundary of the chambers 1, 81, 82, 83, 84, 85, 86, 87. The substrates 9 are transferred along the transfer path by the transfer mechanism (not shown in FIG. 1) being loaded on a carrier 2.

A couple of the chambers 81 and 82, which are aligned on one side of the rectangular loop, are the load-lock chamber 81 and the unload-lock chamber 82. In the load-lock chamber 81, the substrates 9 are loaded on the carrier 2. In the unload-lock chamber 82, the substrates 9 are unloaded from the carrier 2. The chambers 1, 83, 84, 85, 86 aligned on the rest of sides of the rectangular loop are the process chambers in which required processes are carried out. Specifically, the chamber 83 is the pre-heat chamber in which the substrates 9 are heated prior to thin-film depositions. The chamber 1 is the underlying-film deposition chamber in which the underlying film is deposited on each substrate 9. The chamber 84 is the magnetic-film deposition chamber in which the magnetic film is deposited on the underlying film. The chamber 85 is the overcoat deposition chamber in which the overcoat is deposited on the magnetic film. The chambers 87 at the corners of the rectangular loop are the direction-conversion chambers in which direction-conversion mechanisms are provided.

The carrier 2 holds the substrates 9 at several points on the edges. In this embodiment, the carrier 2 holds two substrates 9. The transfer mechanism moves the carrier 2, introducing driving force from the outside of the chambers 1, 81, 82, 83, 84, 85, 86, 87 by magnetic coupling. The carrier 2 is moved as supported with many driven rollers aligned along the transfer path. As for the transfer mechanism, the disclosure in the Japanese laid-open No.H8-274142 can be adopted.

Figure 2:
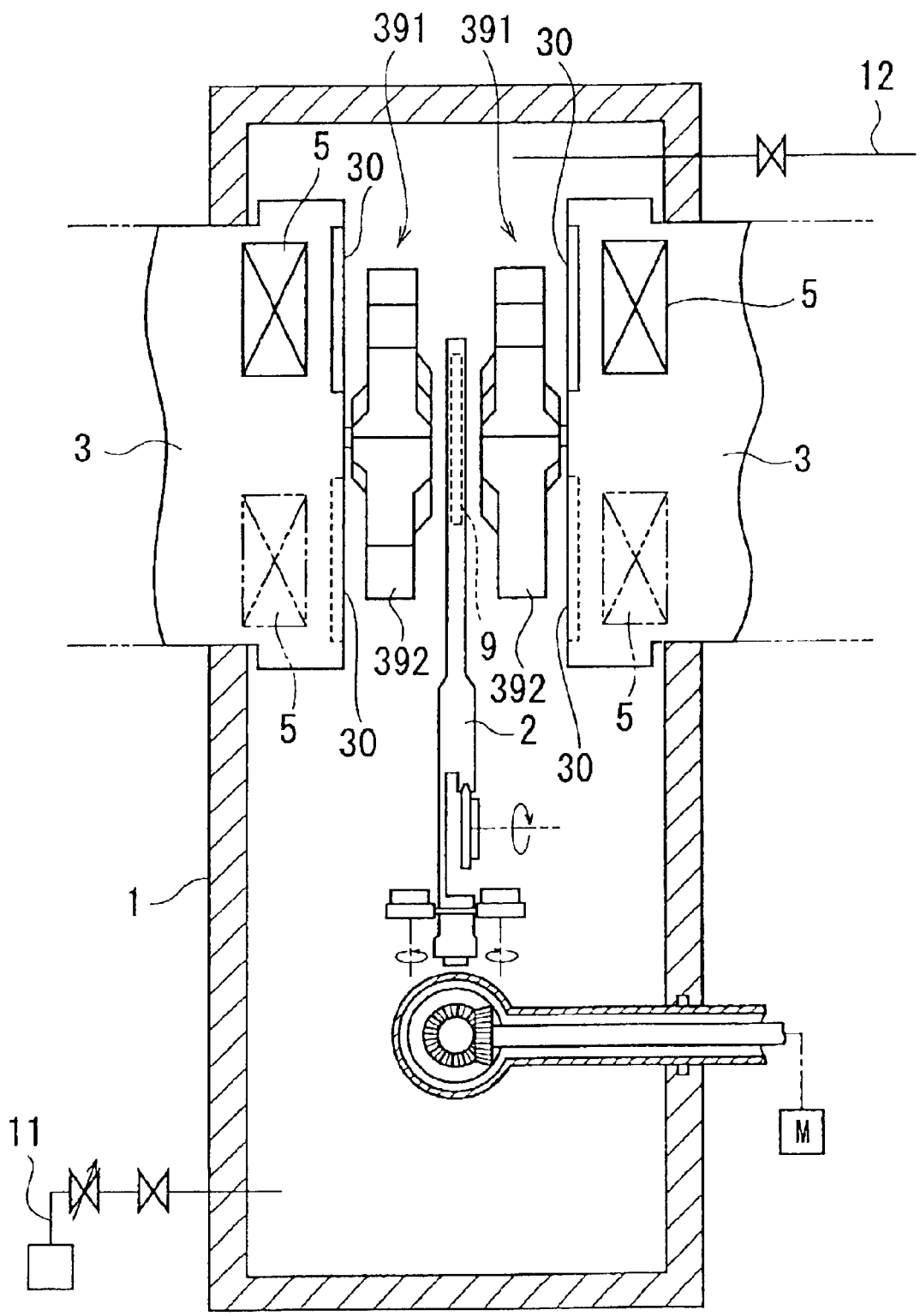
FIG. 2 is a schematic side cross sectional view of the underlying-film deposition chamber 1 shown in FIG. 1.

The underlying-film deposition chamber 1 greatly characterizing this embodiment will be described in detail, using FIG. 2. FIG. 2 is a schematic side cross sectional view of the underlying-film deposition chamber 1. The underlying-film deposition chamber 1 comprises a pumping line 11 for pumping itself, a gas-introduction line 12 through which a required gas is introduced into the inside, a cathode unit 3 having targets 30 of which surfaces to be sputtered is exposed to the inside, sputter power sources (not shown in FIG. 2) to apply voltage to the targets 30 for sputtering, and magnet assemblies 5 provided behind the targets 30 for the magnetron sputtering respectively.

The pumping line 11 comprises a vacuum pump such as cryo-pump so that the underlying-film deposition chamber 1 can be pumped at about $10^{-6}$ Pa. The gas-introduction line 12 is capable of introducing such a process gas as argon at a required flow rate. In this embodiment, the cathode units 3 are provided at both sides to the substrate 9 so that the thin films are deposited on the both surfaces of the substrate 9 simultaneously. Each cathode unit 3 is composed of the target 30, the magnet assembly 5 and other components. In this embodiment, three targets 30 are provide with each cathode unit 3. Three targets 30 are occasionally made of the same material, for example Cr or Cr alloy. However, those are sometimes made of different material as in the case that a thin film of required composition is deposited by the sputtering. The number of the targets 30 maybe more than three. Anyway, utilization of the plurality of targets 30 brings the merits of the productivity upgrading and capability of depositing a thin film of a required composition.

The point characterizing this embodiment is that the system comprises a direction control member 391, which allows the magnetic anisotropy to the magnetic film to be deposited on the underlying film, by selectively letting sputter-particles pass through. "Sputter-particles" means particles released from a target in sputtering. Those are usually in state of atoms.

Figure 3:
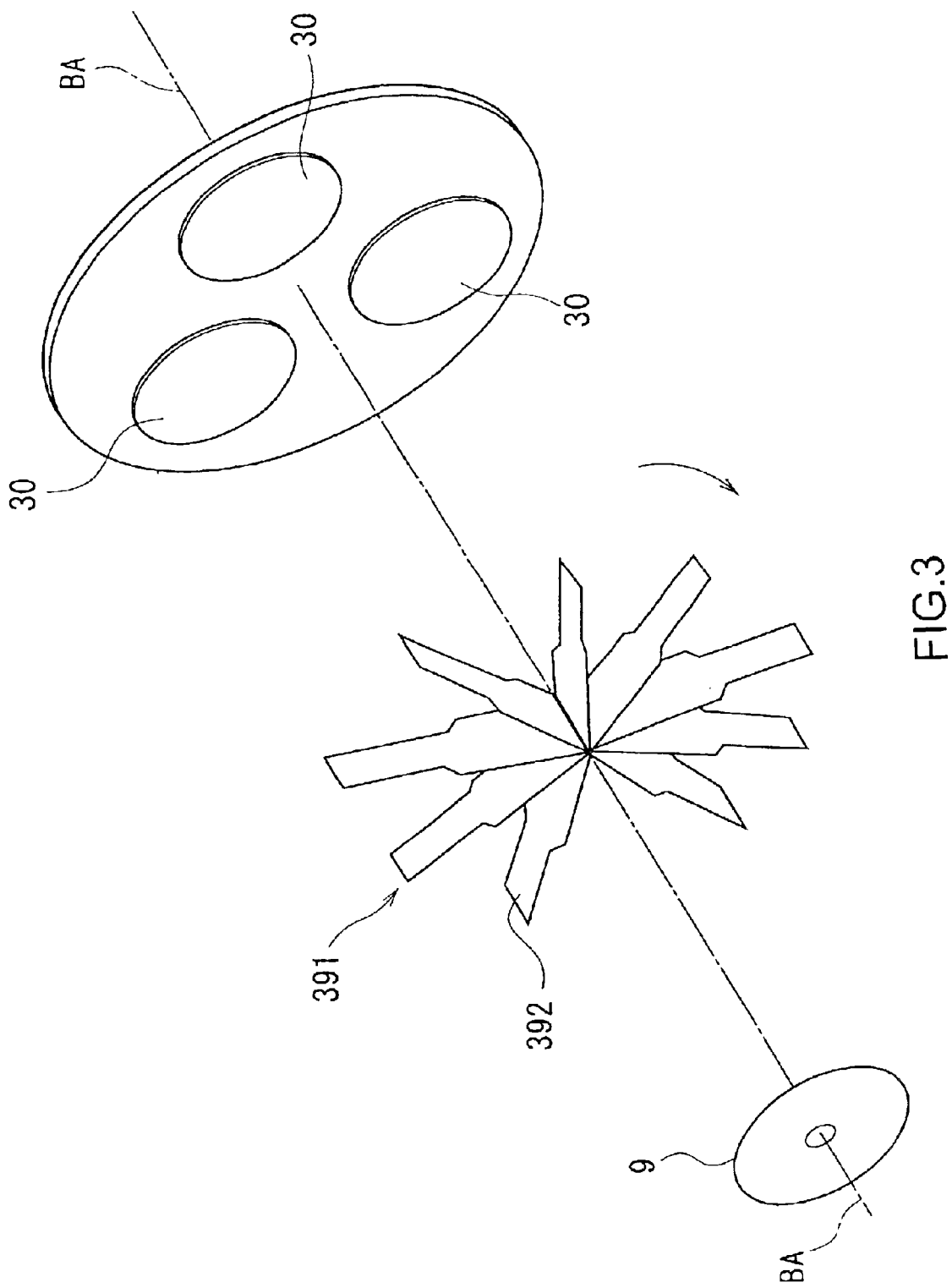
FIG. 3 is a schematic perspective view of direction control member 391 in the system shown in FIG. 1.

The direction control member 391 is provided between the targets 30 and the substrate 9. FIG. 3 is a schematic perspective view of the direction control member 391 in the system shown in FIG. 1. As shown in FIG. 3, the direction control member 391 in this embodiment is formed with louver boards 392 arranged radially. In this embodiment, the direction control member 391 is formed with nine louver boards 392, which are at equal angles, i.e. at every 40 degrees. The direction control member 391 and the substrate 9 are coaxial to each other. In other words, the substrate 9 is stopped at the position where it is coaxial to the direction control member 391. This axis is hereinafter called "basis axis", and designated by "BA" in the FIG. 3, FIG. 4, FIG. 5, FIG. 9 and FIG. 11. As shown in FIG. 3, the louver boards 392 are lengthened along the radial directions from the basis axis BA, and their width directions are along the basis axis BA. Each louver board 392 is wider at the parts close to the basis axis BA, and narrower at the parts further from the basis axis BA.

Figure 4:
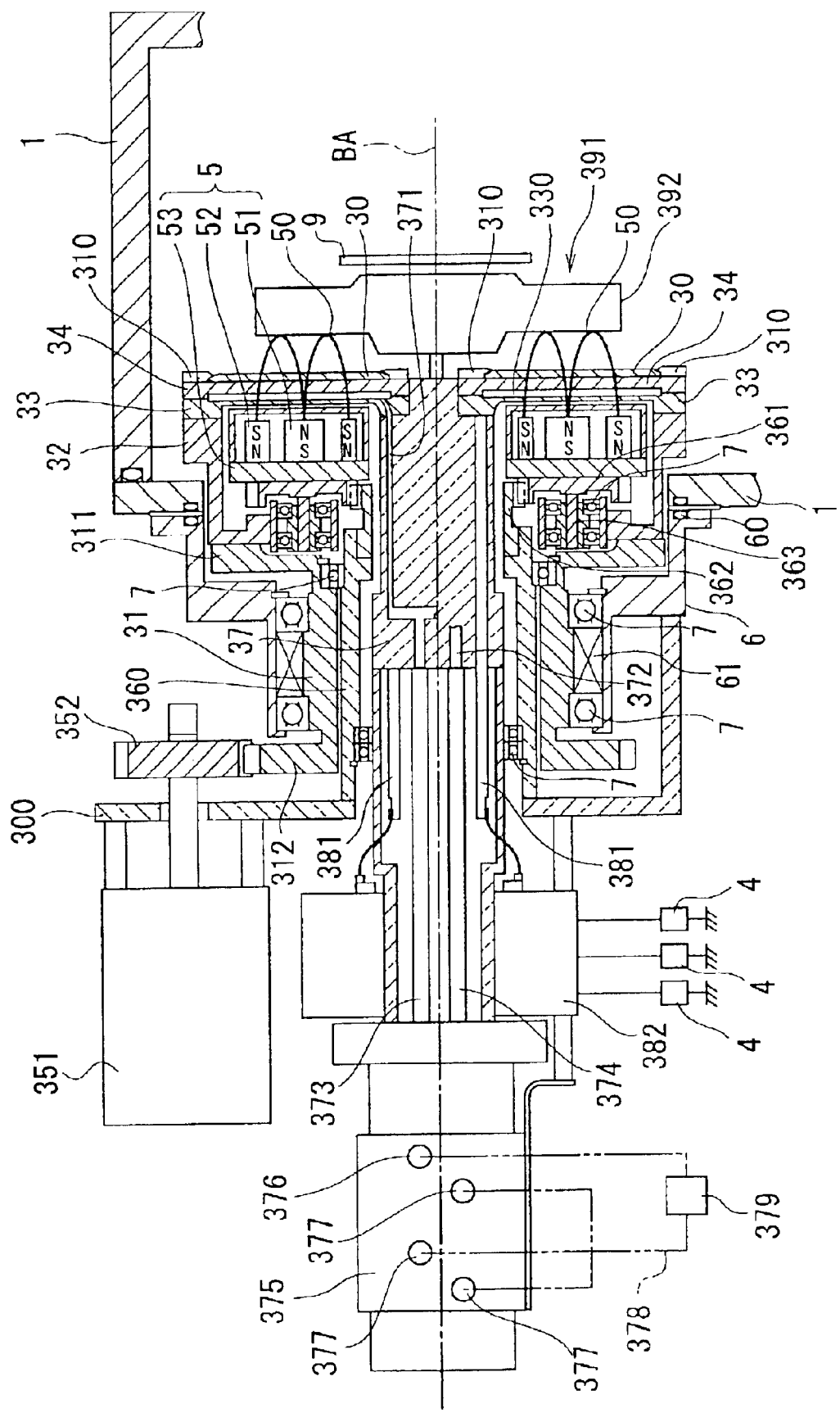
FIG. 4 is a schematic side cross sectional view to show the detailed structure of a rotation mechanism for rotating each target 30 and the direction control member 391 in the underlying-film deposition chamber 1 shown in FIG. 2.

Another point characterizing this embodiment is that the system comprises a rotation mechanism for rotating the direction control member 391 around the basis axis BA in common to the substrate 9. In the system of this embodiment, each target 30 is also rotated coaxially to the substrate 9. The rotation mechanism for the direction control member 391 is commonly used for rotating each target 30. FIG. 4 is a schematic side cross sectional view to show the detailed structure of the rotation mechanism for rotating each target 30 and the direction control member 391 in the underlying-film deposition chamber 1 shown in FIG. 2.

The both cathode units 3 shown in FIG. 2 have the same structure, i.e. being symmetric to the substrates 9. In FIG. 4, the left side one of them is shown. Considering convenience for drawing, the cross section shown in FIG. 4 is not a complete vertical plane but the X—X plane shown in FIG. 5 and to the direction designated by the arrows shown in FIG. 5. An opening a little wider than the cross section of the cathode unit 3 is provided on the sidewall of the underlying-film deposition chamber 1. The cathode unit 3 is inserted to this opening. A unit mount 6 is fixed on the outer surface of the sidewall of the underlying-film deposition chamber 1. The unit mount 6 is cylindrical and has a step in the cross-sectional configuration as shown in FIG. 4. The end of the unit mount 6 is fixed on the outer surface of the chamber 1, inserting a vacuum seal 60 such as an O-ring. A main holder 31 is provided inside the unit mount 6. The main holder 31 is also cylindrical and coaxial to the unit mount 6. The axis of the main holder 31 corresponds to the basis axis BA.

A right holder-flange 311 is provided at the right end of the main holder 31. A cathode mount 32 is fixed on the right holder-flange 311. The cathode mount 32 is cylindrical and coaxial to the basis axis BA, having the cross-sectional shape shown in FIG. 4. The right end of the cathode mount 32 is located inside the chamber 1, on which three cavity boards 33 are fixed. A backing plate 34 is fixed on each cavity board 33. Each target 30 is mounted on each backing plate 34 by a target clamp 310 for easy demount. One cavity board 33, one backing plate 34 and one target 30 are laid over in this order, composing one cathode. Each cathode is fixed on the right end of the cathode mount 32. Not clearly shown in FIG. 4, three circular openings are formed on the right end of the cathode mount 32, corresponding to the positions of the targets 30. Each cathode is fixed in each opening respectively. The cavity boards 33 and the backing plates 34 are disk-shaped and a little larger than the targets 30.

Figure 5:
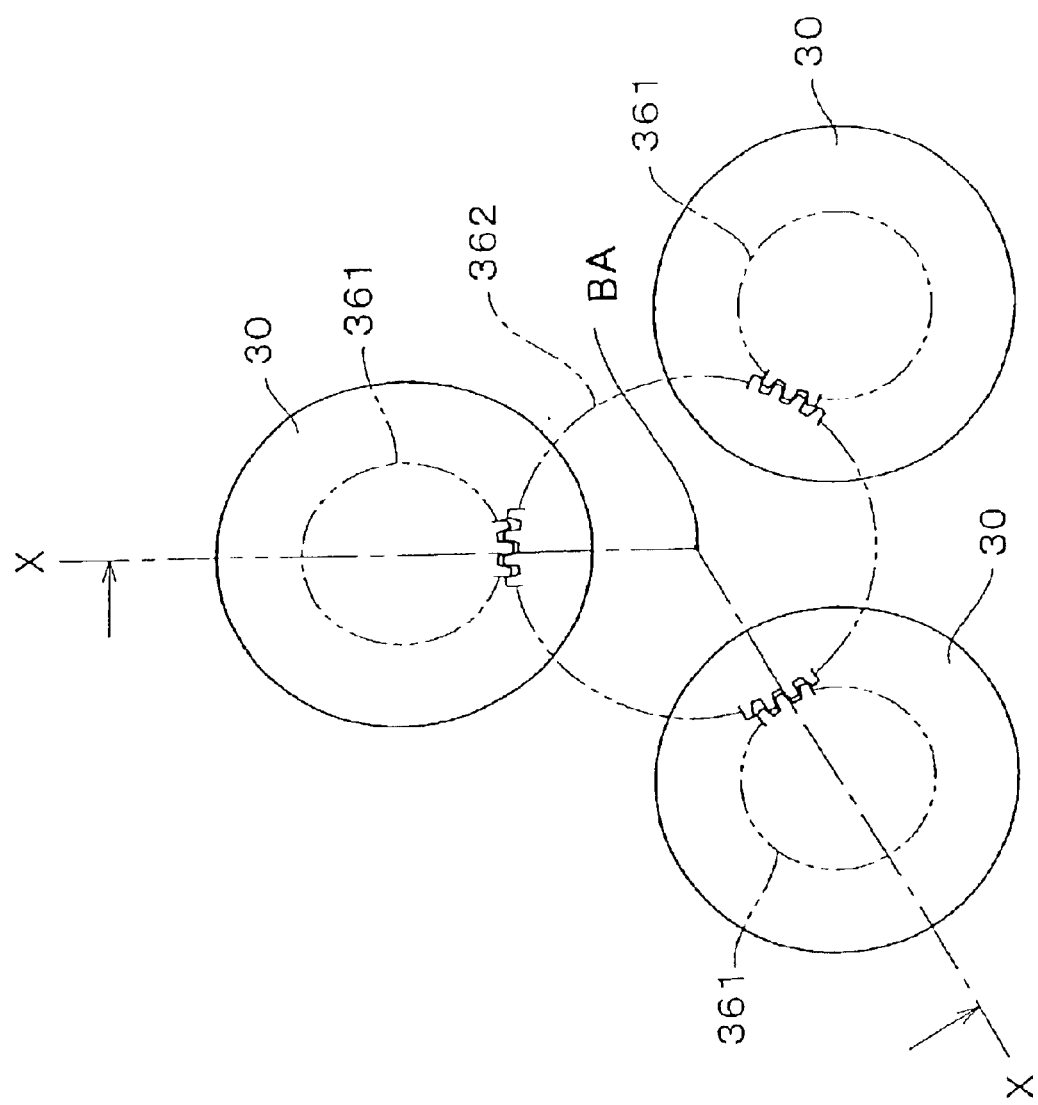
FIG. 5 is a schematic front view to show configuration and layout of the targets 30.

FIG. 5 is a schematic front view to show configuration and layout of the targets 30. As shown in FIG. 5, one cathode unit 3 comprises three targets 30. Each target 30 is all disk-shaped and the same in size. The center of each target 30 is equally distant from each other on a circumference coaxial to the basis axis BA. As shown in FIG. 4, each cavity board 33 is configured so as to form a cavity 330 together with each backing plate 34. Coolant is introduced to each cavity 330.

The rotation mechanism rotates each target 30 and the direction control member 391 around the axis in common to the substrate 9, i.e. around the basis axis BA. The rotation mechanism is roughly composed of the described main holder 31, a rotary actuator 351 such as motor to rotate the main holder 31, and other components. Concretely, a left holder-flange 312 is provided at the left end of the main holder 31. The round edge of the left holder-flange 312 is a gear (hereinafter called flange gear) A driving gear 352 engaging the flange gear is connected with the output shaft of the rotary actuator 351. When the rotary actuator 351 is operated, the main holder 31 is rotated around the basis axis BA through the driving gear 352. As a result, each target 30 and the direction control member 391 are also rotated around the basis axis BA. The main holder 31 is supported by the unit mount 6. A bearing 7 is provided between the unit mount 6 and the main holder 31, allowing the rotation of the main holder 31.

The magnet assemblies 5 are provided behind the target 30 respectively in the cathode mount 32. Each magnet assembly 5 is roughly composed of a center magnet 51, a peripheral magnet 52 surrounding the center magnet 51, and a yoke 53 interconnecting the center magnet 51 and the peripheral magnet 52. Magnetic lines of flux 50, as shown in FIG. 4, penetrates the targets 30, forming arches at the fore discharge spaces. Electrons at the discharge spaces are confined in the closed regions formed with the targets 30 and the arch-shaped magnetic lines of flux 50, resulting in that the highly-efficient magnetron sputtering is established.

The yoke 53, which is provided uprightly, is disk-shaped and a little smaller than the target 30. The center magnet 51 is, for example, short-column-shaped. The peripheral magnet 52 is, for example, elliptical-ring-shaped. Though the target 30 and the yoke 53 are coaxial to each other, shapes and arrangements of the center magnet 51 and the peripheral magnet 52 are asymmetrical to the center axis of the target 30. In other words, the magnetic field applied by the magnet assembly 5 is asymmetrical to the center axis of the target 30. This is to make the time-average magnetic field intensity uniform on the target 30 when the magnet assembly 5 is rotated.

The system comprises an auxiliary rotation mechanism that rotates each magnet assembly 5 around the axis in common to the axis of each target 30. The auxiliary rotation mechanism rotates each magnet assembly 5 by the driving force for the rotation mechanism. Concretely, the auxiliary rotation mechanism is roughly composed of a driven gear 361 provided on each magnet assembly 5, and a stationary gear 362 to transform the torque from the rotation mechanism into the torque for rotating each magnet assembly 5.

Each driven gear 361 is fixed on the bottom of the yoke 53. Each driven gear 361 is coaxial to each target 30. A shaft 363 is fixed on the center of each driven gear 361, being lengthened perpendicularly to each driven gear 361. Each shaft 363 is mounted with the cathode mount 32, inserting a bearing 7. The rotary actuator 351 of the rotation mechanism is mounted on a baseboard 300. The baseboard 300 is provided uprightly. An opening through which a spindle 37 is inserted is provided with the baseboard 300. A gear holder 360 is provided at the edge of the opening, being lengthened perpendicularly to the baseboard 300. The gear holder 360 is roughly a cylinder of which the center axis is in common to the basis axis BA.

The stationary gear 362 is fixed at the top of the gear holder 360. The stationary gear 362, of which teeth are outward, is located at the position where its axis is in common to the basis axis BA. As shown in FIG. 5, the stationary gear 362 engages each driven gear 361. Layout and engagement of the stationary gear 362 and the driven gear 361 are shown in FIG. 5.

As understood from FIG. 4 and FIG. 5, because each magnet assembly 5 is connected with the cathode mount 32 by the shaft 363, when each target 30 is rotated around the basis axis BA as the main holder 31 is rotated by the rotary actuator 351, each magnet assembly 5 and each driven gear 361 are rotated around the basis axis BA as well. Such the eccentric rotation as this is hereinafter called "revolution". "Revolution" means rotation of a member around an axis eccentric from itself. Because each driven gear 361 engages each stationary gear 362 at the side closer to the basis axis BA, each driven gear 361 is rotated around the center axis in common to each target 30 during the revolution. Such the concentric rotation as this is hereinafter called "spin". "Spin" means rotation of a member around the axis concentric with itself. As each driven gear 361 is spun, each magnet assembly 5 is spun together. After all, the magnet assembly 5 performs the revolution around the basis axis BA and the spin around its center axis simultaneously. A bearing 7 is provided between the gear holder 360 and the unit mount 6.

The spindle 37 is provided penetrating the main holder 31 at the center. The spindle 37 holds the cavity board 33, the backing plate 34 and other members at the top. The spindle 37 is column-shaped at the right half, and cylindrical, i.e. hollow, at the left half. The cylindrical left half is the same in diameter as the right half. A coolant introduction channel 371 is perforated through the right column-shaped portion (hereinafter "column portion"). The coolant is introduced through the coolant introduction channel 371 into the cavity 330. The coolant introduction channel 371 is ramified into three branches. Each branch reaches each cavity 330 behind each target 30 respectively. A coolant drainage channel 372 is perforated through the column portion. Not clearly shown in FIG. 4, the coolant drainage channel 372 is provided with each cavity 330.

In the left cylindrical half of the spindle 37 (hereinafter "cylindrical portion"), a coolant introduction pipe 373 and coolant drainage pipes 374 are provided. The coolant introduction pipe 373 is connected with the coolant introduction channel 371. The coolant drainage pipes 374 are connected with the coolant drainage channels 372 respectively, though only one appears in FIG. 4. Power-supply rods 381 are provided penetrating the column portion and the cylindrical portion of the spindle 37. The power-supply rods 381 are to supply power for the sputtering discharge to the targets 30. Three power-supply rods 381 are provided, though only one appears in FIG. 4. As shown in FIG. 4, the top of the power-supply rod 381 is in contact with the cavity board 33. The cavity board 33 and the backing plate 34 are made of metal such as stainless steel or copper so that the power can be supplied through them to the targets 30. Insulators (not shown) are provided between the power-supply rods 381 and the spindle 37, between each cathode and the spindle 37, and at other required places. Therefore, the power supplied through the power-supply rods 381 does not leak to the spindle 37. In addition, insulators are provided between the cathodes so that each cathode can be insulated from each other.

Figure 6:
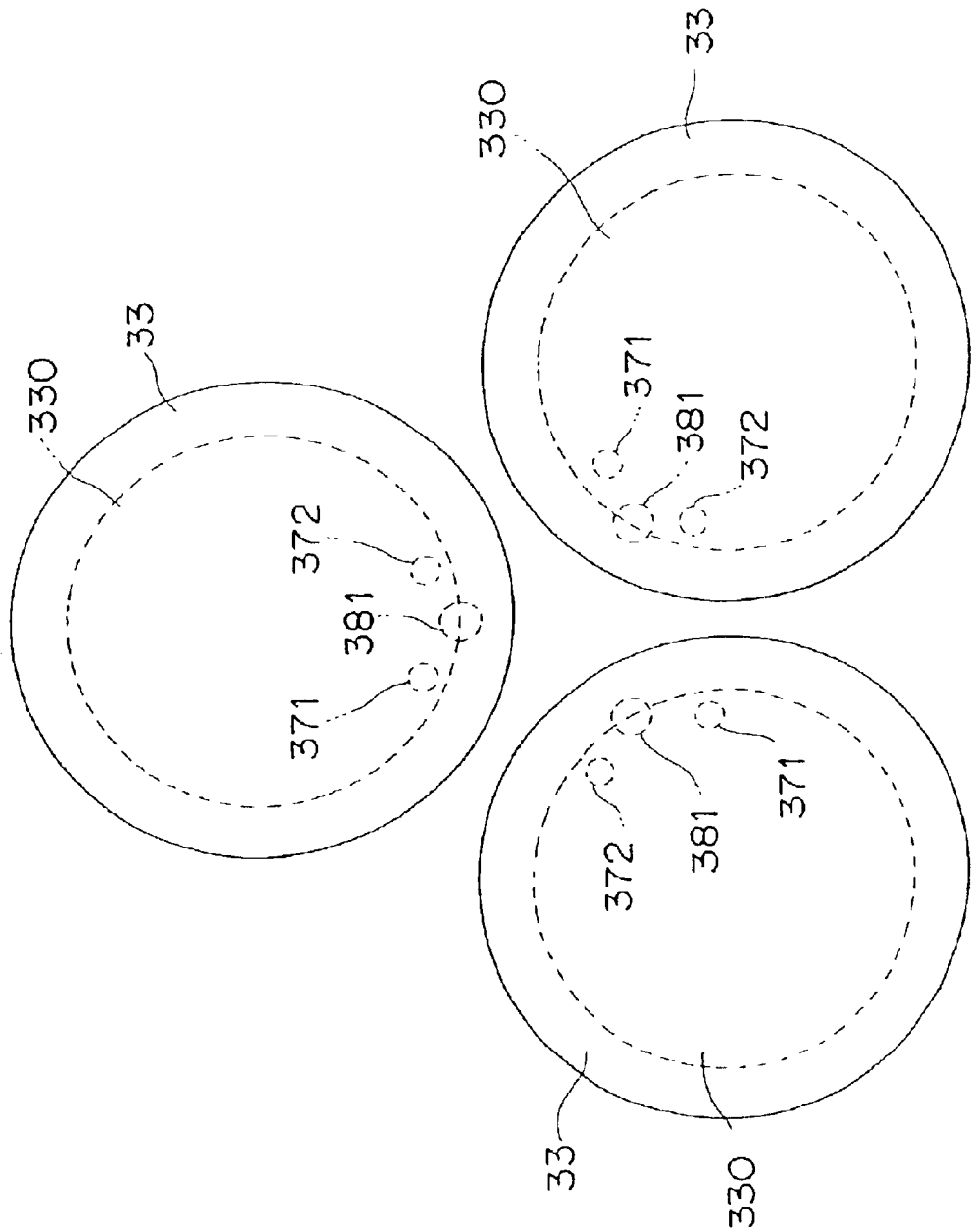
FIG. 6 is a schematic front view to show the inlet and outlet positions of the coolant, and the power-supplying positions.

FIG. 6 is a schematic front view to show the inlet and outlet positions of the coolant, and the power-supplying positions. As shown in FIG. 6, the each power-supply rod 381 is in contact with the each cavity board 33 at the positions nearest to the basis axis BA. The coolant introduction channel 371 and the coolant drainage channel 372 are communicated with the cavity 330 at positions close to the contact position of the power-supply rod 381. The contact position of the power-supply rod 381 is located between the inlet position from the coolant introduction channel 371 and the outlet position to the coolant drainage channel 372.

In the described revolution and spin, the spindle 37 is also spun around the basis axis BA. A slip ring 382 and a rotary joint 375 are provided so that the supply of the power and the circulation of the coolant are enabled in spite that the spindle 37 is spun. As shown in FIG. 4, the slip ring 382 is provided surrounding the left end of the spindle 37. The power-supply rods 381 are connected with the slip ring 382 by cables. The slip ring 382 is connected three sputter power sources 4, which are provided for three targets 30 respectively.

The slip ring 382 is to secure electrical continuity by contacting a spring band on a rotating cylinder. As the slip ring 382, for example "φ150-60 3ch SR" of Globe Tech Inc., Tachikawa, Tokyo, Japan can be employed. The rotary joint 375 is connected at the left end of the spindle 37. The rotary joint 375 comprises a coolant introduction hole 376 communicating to the coolant introduction pipe 373, and three coolant drainage holes 377 communicating to three coolant drainage pipes 374 respectively. In spite of the rotation of the spindle 37, the rotary joint 375 secures communication of the coolant introduction pipe 373 and the coolant introduction hole 376, and communication of each coolant drainage pipe 374 and each coolant drainage hole 377. As the rotary joint 375, for example "KT-4-02-1W" of KOYO YUATSU Co., Ltd., Setagaya, Tokyo, Japan can be employed.

As shown in FIG. 4, the coolant introduction hole 376 communicates to each coolant drainage hole 377 through a pipe 378 and a circulator 379. The coolant cooled at a required low temperature at the circulator 379 is introduced to each cavity 330 through the coolant introduction hole 376, the coolant introduction pipe 373 and each coolant introduction channel 371. The coolant is drained from each cavity 330 back to the circulator 379 through each coolant drainage channel 372, each coolant drainage pipe 374 and each coolant drainage hole 377.

Three power-supply rods 381, the slip ring 382, three sputter power sources 4 and other components compose a power-supply line to supply the power for the sputtering discharge to the targets 30. Each sputter power source 4 is capable of independent control of its output level so that the power supplied to each target 30 can be controlled independently.

In the described structure of the cathode unit 3, vacuum seals such as O-rings are provided at required places so that leakage of vacuum maintained in the underlying-film deposition chamber 1 can be prevented. Especially, a magnetic-fluid seal 61 is adopted at the place between the unit mount 6 and the main holder 31. The magnetic-fluid seal 61, which utilizes magnetic fluid as sealant, prevents leakage of vacuum at the clearance of the unit mount 6 and the main holder 31, allowing the rotation of the main holder 31.

Following is the description about operation in the underlying-film deposition chamber 1. The carrier 2 holding the substrates 9 is moved into the underlying-film deposition chamber 1 and stopped at the required position. This position is where the center of the first substrate 9 is on the basis axis BA. The underlying-film deposition chamber 1 is pumped through the pumping line 11 at a required vacuum pressure in advance. Then, the rotation mechanism is operated to rotate the cathode unit 3 and the direction control member 391 together around the basis axis BA, as well as the auxiliary rotation mechanism is operated to rotate each magnet assembly 5 around the center axis of each target 30.

Continuing the rotations, the process gas is introduced through the gas-introduction line, and pressure in the underlying-film deposition chamber 1 is maintained at a required value. In this state, one of, some of, or all sputter power sources 4 is operated, resulting in that the sputter discharge is ignited. Through the discharge, sputter-particles released from the targets 30 reach the substrate 9, thereby depositing a required underlying film on the substrate 9. The underlying film is occasionally deposited by sputter-particles from the targets 30 made of the same material. Otherwise, it is occasionally deposited by sputter-particles from the targets 30 made of different materials. In other words, an underlying film of desired composition is occasionally deposited by sputter-particles of different materials from the targets 30. Anyway, because each target 30 is revolved around the basis axis BA by the rotation mechanism, the sputter-particles are mingles uniformly, which enables deposition of the uniform and homogeneous underlying-film. After the deposition onto the first substrate 9, the carrier is moved at a required distance in the underlying-film deposition chamber 1. Then, the center of the second substrate 9 is located on the basis axis BA. At this location, the same deposition is carried out onto the second substrate 9.

Figure 7:
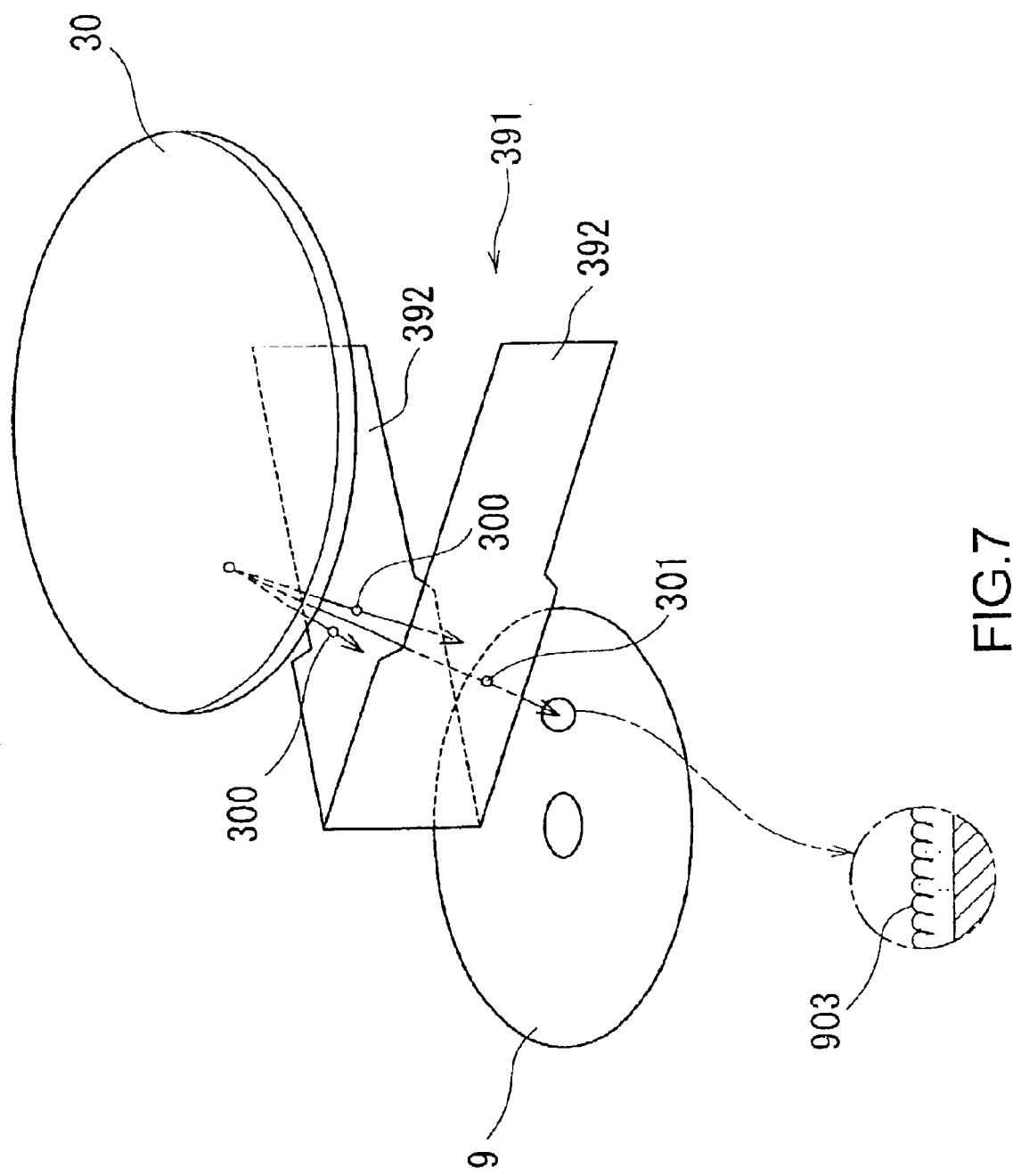
FIG. 7 is a schematic perspective view to show the technical advantage of the direction control member 391.

In the described underlying-film deposition, the direction control member 391 and the rotation mechanism bring the technical advantage of enhancing the magnetic anisotropy. This point will be described as follows, using FIG. 7. FIG. 7 is a schematic perspective view to show the technical advantage of the direction control member 391. As described, the problem of the thermal decay has been the bottleneck for higher-density magnetic recording. Recently, it has turned out that allowance of the magnetic anisotropy is effective for suppressing the thermal decay. The magnetic anisotropy means that coercive force varies, depending on direction of magnetic field in magnetization. Otherwise, it is expressed as coercive force depends on magnetization direction.

As a method for allowing the magnetic anisotropy to the magnetic film, it has been examined to control orientation of crystals composing the film. Concretely, crystals in each grain are made not disorder but oriented to the same direction to some extent. When the magnetic film is magnetized to this direction, coercive force becomes greater than in case it is magnetized to another direction. For controlling crystal orientation, there has been a method where fine grooves are formed on a surface and a film is deposited thereon. When a film is deposited on the surface of fine grooves, crystals of the film tend to be oriented to longitudinal directions of the grooves. As a result, the magnetic anisotropy is allowed to the deposited film along the longitudinal directions of the grooves. Such a surface configuration for allowing the magnetic anisotropy is called "texture" in this field.

In the described conventional hard-disk manufacturing process, for example, fine grooves as texture are provided on a NiP film. Because a hard-disk drive rotates a magnetic recording disk around its center axis against a stationary magnetic-head during write-and-readout of information, directions of magnetization is usually circumferential, or along tangents on circles coaxial with the disk. These directions are hereinafter simply called "circumferential directions". In such the magnetization, therefore, the magnetic anisotropy is required to be allowed to circumferential directions. For such the anisotropy, fine grooves as texture are usually provided circumferentially and coaxially to a substrate. In a cross section, this type of texture is sawtooth-shaped. Crystal orientation of an underlying film deposited on such the NiP film having the grooves tends to be circumferential, resulting in that crystal orientation of a magnetic recording film deposited on it tends to be circumferential as well. Therefore, the magnetic anisotropy where coercive force is higher in the circumferential magnetization is allowed to the magnetic film.

Figure 8:
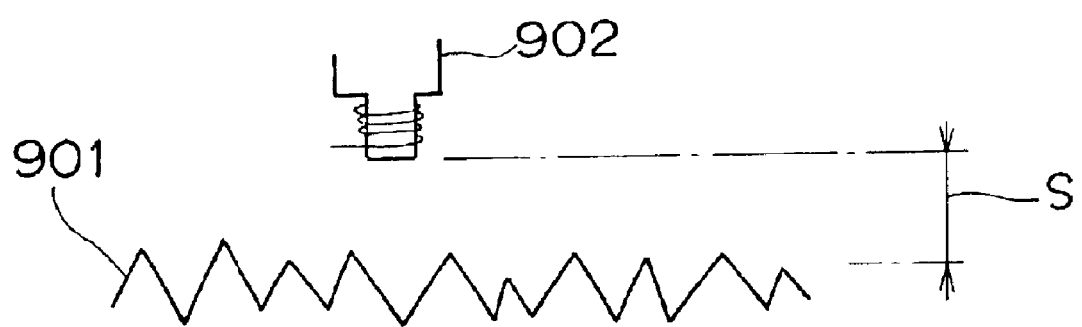
FIG. 8 shows relation of spacing and texture.

However, the described anisotropy allowance by texture bears some disadvantages with respect to demand for narrowing spacing. This point will be described, using FIG. 8. FIG. 8 shows relation of spacing and texture. As described, to narrow spacing is required for enhancing recording density. However, texture could be the obstructive factor for narrowing spacing. As shown in FIG. 8, if a texture exists, the surface 901 of a magnetic recording layer is uneven, i.e. concave-convex, corresponding to the shape of the texture. The distance to a magnetic head 902, i.e. spacing S, can be narrower to some extent at the convexes. However, spacing S is inevitably wider at the concaves. Therefore, write-and-readout of information might be unstable at the concaves. If the magnetic head 902 is located closer to the surface 901 of the magnetic recording layer, it would contact such an overlying layer as an overcoat (not shown in FIG. 7). As a result, there might arise the problem that the magnetic head 902 is stuck on the magnetic recording disk, or the magnetic recording disk is damaged by the magnetic head 902. Such the problems can be solved by providing a lubricant layer on the top of the magnetic recording disk. However, as far as a texture exists, it is impossible to make spacing narrower than height (or depth) of the texture. Therefore, there is great demand for a technique to allow the magnetic anisotropy without providing texture.

As described, allowance of the magnetic anisotropy is effective for suppressing the problem of the thermal decay in magnetic recording disks such as hard-disks. From the research by the inventors, it has turned out that the magnetic anisotropy can be obtained by controlling directions of sputter-particles incident on the substrate during the deposition. Concretely, the inventors have discovered that the magnetic anisotropy is allowed to a magnetic film by making a majority of sputter-particles incident not perpendicularly but obliquely on the substrate in depositing an underlying film. The inventors have also discovered that; when along-substrate direction-components of such the obliquely-incident sputter-particles are oriented to a direction in depositing the underlying film, the magnetic anisotropy allowed to the magnetic film deposited on the underlying film is enhanced in a direction.

Which magnetic anisotropy should be allowed, i.e. which direction coercive force should be made greater at, depends on structure of a magnetic head or another factor. In the usual longitudinal recording, magnetization for recording is carried out to the circumferential directions. In such the longitudinal recording, what should be allowed is the magnetic anisotropy that coercive force is greater to the circumferential directions.

Taking an example, there may be the case that a Cr film as the underlying film is deposited on a glass-made substrate 9, and a CoCrTa film is deposited as a magnetic film over the Cr film. The magnetic anisotropy to the circumferential directions can be allowed to the CoCrTa film, if the Cr film deposition is carried out by a majority of incident sputter-particles having direction-components from the center to the edge on the substrate 9, i.e. to radius directions.

The above point will be described more concretely, referring to FIG. 7. In FIG. 7, sputter-particles 300, 301 released from a point on the target 30 travel dispersively to various directions, though they have such a distribution as one that obeys the cosine law. In the system of this embodiment, however, the direction control member 391 obstructs the sputter-particles 300 having large direction-components to tangent directions on circles coaxial to the substrate 9. In other words, sputter-particles 301 having no or small direction-components to tangent directions on circles coaxial to the substrate 9 can reach the substrate 9. The sputter-particles 300 having large direction-components to the tangent directions may reach the direction control member 391, and adhere to it, not reaching the substrate 9. After all, a majority of sputter-particles that reach the substrate 9 has small direction-components to the tangent directions. Concretely, as shown in FIG. 7, the majority of sputter-particles that reaches the substrate 9 has large direction-components inward along radius directions.

When a Cr film as the underlying film is deposited by such the sputter-particles having large direction-components to radius directions, many of crystals composing the Cr film are in state that their (1, 1, 0) surfaces are directed to the circumferential directions. Because of this, when a CoCrTa film as the magnetic film is deposited on the Cr film, c axis of cobalt, which is the magnetization-ease axis, is often directed to a circumferential direction. As a result, the magnetic film obtains the magnetic anisotropy that coercive force is greater in the circumferential magnetization.

Otherwise, if a NiP film is deposited on the substrate, and a Cr film and CoCrTa film are deposited thereon, the circumferential magnetic anisotropy is obtained by different direction control. Concretely, when the Cr film is deposited as the underlying film, a majority of sputter-particles having direction-components to the circumferential directions is made incident on the substrate 9. As a result, the CoCrTa film deposited thereon obtains the circumferential magnetic anisotropy. Anyway, film deposition accompanied by such the sputter-particles direction control enables high magnetic anisotropy of magnetic films without providing texture.

As described, the direction control member 391 is formed with the louver boards 392 that are lengthened radially and arranged apart at equal angles. This point brings the technical advantage that uniform deposition is enabled, because the sputter-particles direction control functions uniformly. If an angle of neighboring two louver boards 392 is wider than 60 degrees, more number of sputter-particles 300 having large direction-components to the tangent directions may reach the substrate 9 as well, resulting in that the magnetic anisotropy is not allowed sufficiently. When each of neighboring two louver boards 392 makes an angle of 60 degrees or less, the sufficient magnetic anisotropy that coercive force is greater in circumferential magnetization is allowed to the magnetic film.

Still, the direction control member 391 may have another configuration than described. For example, it may be a board-like member at which many through-holes are provided so that sputter-particles can pass through. Cross section of each through-hole is circle or ellipse. For example, the through-holes are lengthened obliquely to the radius directions of the substrate 9. However, in comparison to the described multi-louver-board type, this type of the direction control member has the disadvantage that the through-holes are easily clogged up with sputter-particles. Sputter-particles that reach the direction control member may easily adhere to it. Therefore, a thick film is deposited on the inner surface of each through-hole as the deposition process is repeated. As a result, cross section of each through-hole becomes narrower, reducing the number of sputter-particles that can pass through and reach the substrate 9. This means decrease of the sputter rate. Therefore, the direction control member has to be replaced after the deposition process is repeated to some extent of times.

In anyway, such the trough-hole type direction control member and the described multi-louver-board type direction control member provide passages for sputter-particles to reach the substrate. As in the multi-louver-board type, if the passages for sputter-particles are not closed but open in their cross section, their cross section areas are not reduced so much by deposited films. Therefore, such a member does not have to be replaced even after the deposition process is repeated many times. This brings the merits of lower maintenance frequency, which contributes to higher productivity. The described direction control member 391 formed with multiple louver boards 392 belongs to this type. Each passage may be open at two or more parts in its cross section.

The rotation of the direction control member 391 brings the technical advantage of uniform and homogeneous film deposition. As understood from FIG. 8, the direction control member 391 makes so called "shadow" on the substrate 9. "Shadow" means that some sputter-particles are shut out, not reaching the substrate 9. Therefore, if the direction control member 391 is not rotated, the deposited film becomes very thin at the regions of "shadow" on the substrate 9, because much less number of sputter-particles is incident on the regions. This leads to that thickness of the film is out of uniform. When the direction control member 391 is rotated against the stationary substrate 9 as in the described embodiment, such non-uniformity of the film thickness is not brought. It is not always required that the direction control member 391 is rotated together with the cathode unit 3. It may be rotated separately from the cathode unit 3.

The rotation speed of the direction control member 391 is in the range of 6 rpm to 1200 rpm. At such the rotation speed, the direction control member 391 would be equivalently stationary for the sputter-particles, because travel speeds of the sputter-particles are much higher than that. Accordingly, there is no worry that the sputter-particles 300 having large direction-components to radius directions would be obstructed by the louver boards 392 being rotated.

The point that the direction control member 391 is composed of the louver boards 392 lengthened radially also brings the technical advantage that the cross contamination of the targets 30 can be prevented. Sputter-particles released from one target 30 might adhere to another target 30. The adherent sputter-particles are released by re-sputtering. However, in case each target 30 is made of material different from each other, it leads to that particles of not inherent material of each target 30 itself are released. If this takes place, it would be difficult to control sufficiently component distribution of the film being deposited, resulting in that component distribution of the deposited film tends to be out of uniform.

Contrarily in this embodiment, sputter-particles released from one target 30 are prevented from adhering to another target 30 by the louver boards 392. Therefore, the described cross contamination can be prevented effectively. For the same purpose, a member to partition each space at which each target 30 may be provided. Moreover, the direction control member may be formed with one group of louver boards having both functions of the direction control and the partition, and another group of louver boards having the only function of the direction control. For example, when three targets are provided and six louver boards composes the direction control member, three louver boards are interposed between the targets respectively, and the other three louver boards are on the targets respectively in the front view. In this configuration, six louver boards are usually arranged at every 60 degrees. The group of the louver boards between the targets may be fixed separately from the group of the louver boards over the targets.

In the described embodiment, each target 30 is not coaxial to the substrate 9 but located eccentrically from the substrate 9. This point is much relevant to magnetic anisotropy enhancement as well. This point will be described, using FIG. 9. FIG. 9 is a schematic view to show the technical advantage brought by the eccentric layout of the target 30 and the substrate 9. The described magnetic anisotropy allowance by the direction control is more effective when a large number of sputter-particles is incident not perpendicularly but obliquely on the substrate 9. As shown in FIG. 9(1), when the substrate 9 and the target 30 face to each other coaxially, comparatively more number of sputter-particles is incident perpendicularly on the substrate 9. Contrarily, as shown in FIG. 9(2), when the substrate 9 and the target 30 face eccentrically to each other, almost no sputter-particles is incident perpendicularly on the substrate 9, but a large number of sputter-particles are incident obliquely on the substrate 9.

As understood from FIG. 9(1), in the case that the substrate 9 and the target 30 face coaxially to each other, the direction control by the described direction control member 391 brings not much effect of the magnetic anisotropy enhancement, because the sputter-particles incident on the substrate 9 only have smaller direction-components in parallel to the substrate 9. Contrarily, as shown in FIG. 9(2), when the substrate 9 and the target 30 face eccentrically to each other, the direction control is more effective because the sputter-particles incident on the substrate 9 have larger direction-components in parallel to the substrate 9. Accordingly, remarkable enhancement of the magnetic anisotropy is enabled.

Details of the eccentric arrangement depend on sizes of the substrate 9 and the target 30, distance between them, and directional distribution characteristic of the sputter-particles released from the target 30. When the line interconnecting the center of the substrate 9 and the center of the target 30 makes an angle ranging from 15 degrees to 75 degrees against the perpendicular to the substrate 9, sufficient effect of the magnetic anisotropy allowance is obtained. This angle is designated as "θ" in FIG. 9(2). In the case that only one target 30 is provided eccentrically as in FIG. 9(2), it is indispensable to relatively rotate the target 30 or the substrate 9. When a plurality of targets 30 are provided, the rotation of the targets 30 is still preferable in view of uniformity and homogeneity of the film deposition, though sometimes it is made dispensable by uniform arrangement of the targets 30.

Next will be described other components of the system than the underlying-film deposition chamber 1. The magnetic-film deposition chamber 84 shown in FIG. 1 is the chamber in which the magnetic-film deposition is carried out by sputtering. The target in the magnetic-film deposition chamber 84 is made of such material as CoCrTa alloy because material of the magnetic film is such. Arrangement of the target and the substrate 9 in the magnetic-film deposition chamber 84 may be the normal stationary facing type, or the described eccentric rotational type that the target is rotated eccentrically to the stationary substrate 9. A direction control member of the same configuration is sometimes used for the magnetic-film deposition. Higher magnetic anisotropy is expected furthermore when the magnetic film is deposited as the same direction control is carried out additionally. The direction control member may be provided only in the magnetic-film deposition chamber 84. In other words, the direction control of the sputter-particles may be carried out only in depositing the magnetic film. Even in this case, the sufficient magnetic anisotropy is allowed to the magnetic film.

The pre-heat chamber 83 is the chamber to heat the substrate 9 up to a required temperature prior to the film depositions. During the depositions, it is often required to keep the substrate 9 at a temperature higher than room temperature. Therefore, the substrate 9 is pre-heated in the pre-heat chamber 83 so that temperature of the substrate 9 can reach a required high temperature when the substrate 9 enters the underlying-film deposition chamber 1 and the other deposition chambers 84, 85. The pre-heat also has the object of degassing, i.e. release of absorbed gas.

The overcoat deposition chamber 85 is the chamber to deposit the described DLC film as the overcoat. The overcoat deposition chamber 85 is so configured that the DLC film can be deposited by plasma-enhanced chemical vapor deposition (PECVD) or sputtering. In case of PECVD, organic gas such as $CH_4$ is introduced into the overcoat deposition chamber 85, which shifts in state of plasma through high-frequency (HF) discharge. Gas decomposition producing carbon takes place in the plasma, resulting in that a carbon film is deposited on the substrate 9. When the substrate 9 is heated at an adequate high temperature in this deposition, the film grows as the DLC film. In case the DLC film is deposited by sputtering, a target made of carbon is used. One of other process chambers 86 is so designed that a lubricant layer is prepared on the overcoat, if necessary.

Next will be described operation of the system of this embodiment. First, a couple of unprocessed substrates 9 are loaded to a first carrier 2 in the load-lock chamber 81. This carrier 2 is moved into the pre-heat chamber 83, in which the substrates 9 are pre-heated. Meanwhile, another couple of unprocessed substrates 9 are loaded to a next carrier 2 in the load-lock chamber 81. After one tact-time passes, the first carrier 2 is moved to the underlying-film deposition chamber 1, in which the underlying-films are deposited as described. Meanwhile, the next carrier 2 is moved to the pre-heat chamber 83, in which the substrates 9 are pre-heated, and another couple of unprocessed substrates 9 are loaded to a next carrier 2 in the load-lock chamber 81.

After one more tact-time passes, the carrier 2 in the underlying-film deposition chamber 1 is moved to the magnetic-film deposition chamber 84, in which the magnetic films are deposited on the underlying films. The carrier 2 in the pre-heat chamber 83 is moved to the underlying-film deposition chamber 1, and the carrier 2 in the load-lock chamber 81 is moved into the pre-heat chamber 83.

Repeating such the steps, every carrier 2 is moved into a next chamber at every tact-time. The pre-heat, the underlying-film deposition, the magnetic-film deposition, and the overcoat deposition, are carried out on each substrate 9 in this order. After the overcoat deposition, the carrier 2 is moved into the unload-lock chamber 82, in which the processed substrates 9 are unloaded from the carrier 2. The system of this embodiment comprises two underlying-film deposition chambers 1. Therefore, the underlying film is deposited at a half of the required total thickness in the first underlying-film deposition chamber 1, and deposited at the rest half in the second underlying-film deposition chamber 1. This point is the same in two magnetic-film deposition chambers 84 and two overcoat deposition chambers 85.

As described, the system of this embodiment enables allowance of the high magnetic anisotropy without providing texture, because of the direction control member 391. In addition, there is the little problem that the passages for the sputter-particles are clogged, because each passage on the direction control member 391 is not close but open in its cross section. As described, the direction control member 391 is provided coaxially to the substrate 9 and is formed with the plural louver boards 392 arranged symmetrically to the axis, to which targets 30 are as well provided symmetrically. This is the other point that brings the uniform and homogeneous film deposition onto the substrate 9. The plurality of the targets 30 enables productivity upgrading and deposition of a film of a desired composition without difficulty. Moreover, the uniform and homogeneous film deposition is enabled also because the targets 30 are located at equal distances. Because one rotation mechanism is commonly used for rotating the direction control member 391 and for rotating each target 30, simplification and cost reduction of the system are accomplished.

Figure 10:
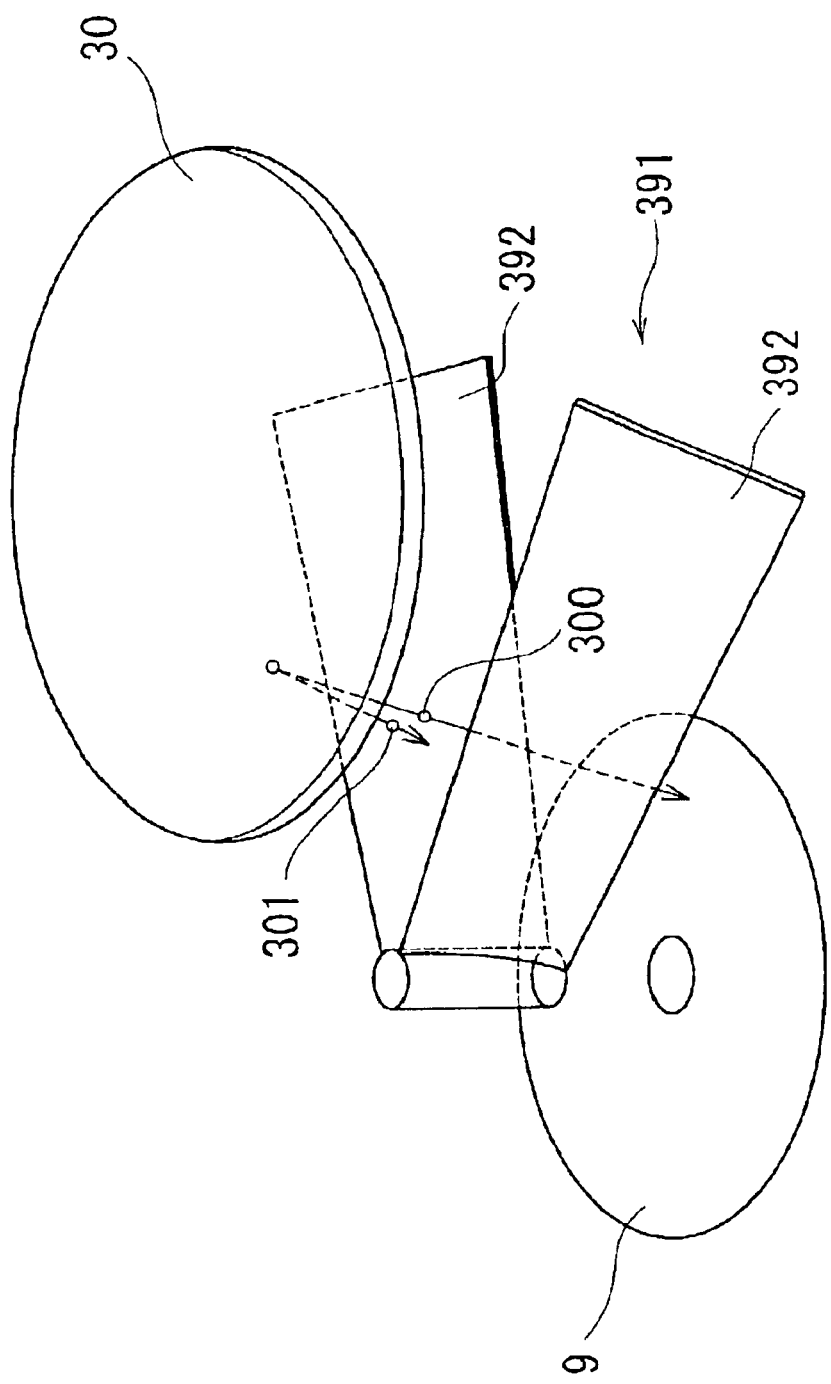
FIG. 10 is a schematic perspective view to show another example of the direction control member 391 and its technical advantage.

There are many modifications for the direction control member 391, though it was formed with the radially-lengthened louver boards 382 in the described embodiment. FIG. 10 is a schematic perspective view to show another example of the direction control member 391 and its technical advantage. The example of the direction control member 391 shown in FIG. 10 is formed with the louver boards 392 provided obliquely to the axis of the substrate 9, being similar to a blowing fan. Though only two louver boards 392 appear in FIG. 10, actually about eight to twelve louver boards 392 are provided at equal angles. Each louver board 392 is in the same posture, i.e. inclined at equal angles to the axis of the substrate 9.

Contrarily from the described embodiment, the direction control member 391 shown in FIG. 10 obstructs the sputter-particles 301 having large direction-components to the radius directions of the substrate 9. Relatively, the sputter-particles having large direction-components to the tangent directions on the circumferences coaxial to the substrate 9 pass through the direction control member 391 easily. There may be the case the direction control member 391 shown in FIG. 10 brings the magnetic anisotropy that coercive force is higher in the circumferential magnetization.

Figure 11:
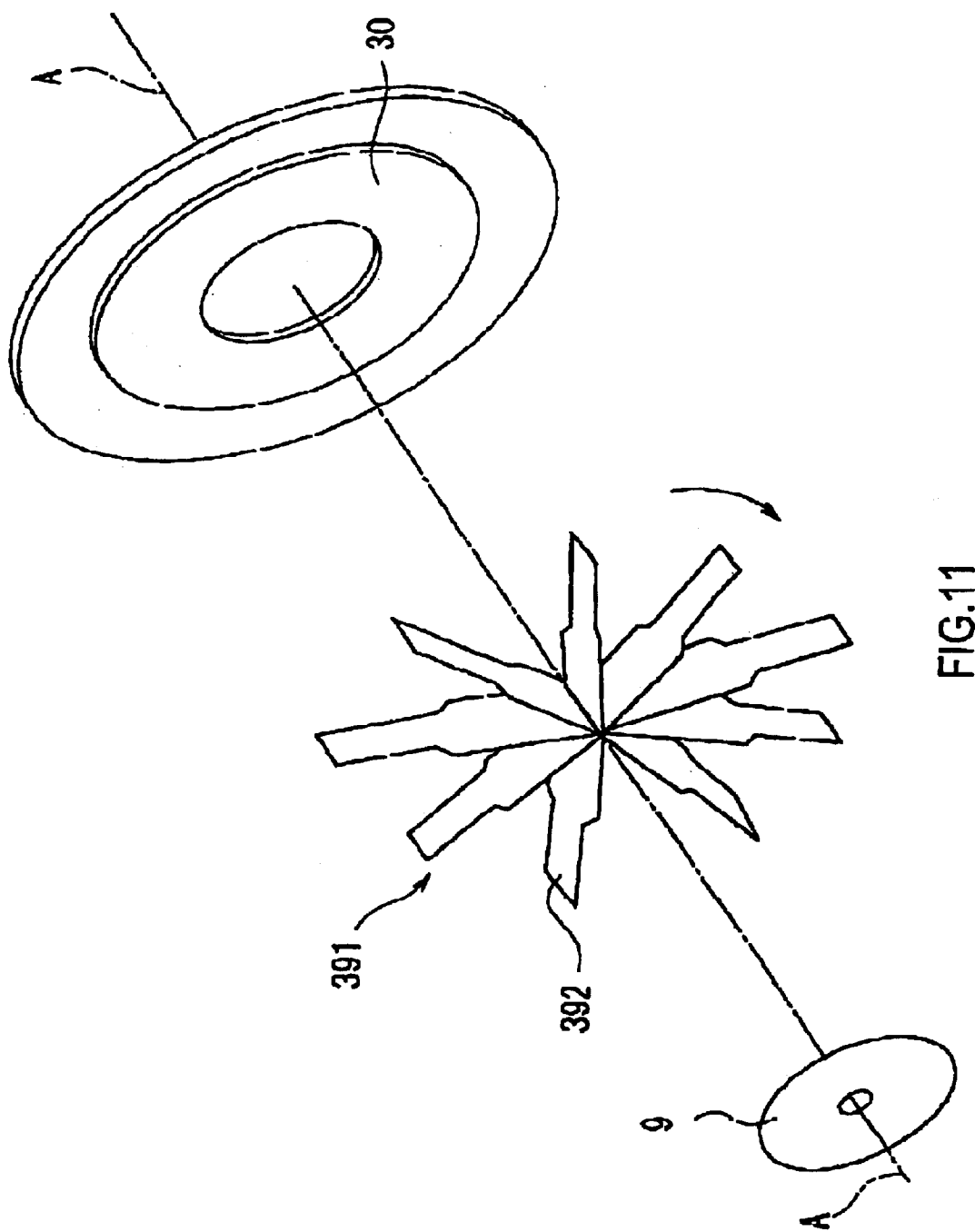
FIG. 11 is a schematic perspective view of the main part of a system comprising a different-type target 30.

Modifications on the targets 30 will be described next. FIG. 11 is a schematic perspective view of the main part of a system comprising a different-type target 30. A deposition chamber in this system comprises only one target 30. As shown in FIG. 11, the target 30 is ring shaped, which is like a disk having a round coaxial opening at the center. The target 30 is coaxial to the substrate 9. Configuration of the target 30 shown in FIG. 11 is equal to one that three targets 30 in the described embodiment are elongated circumferentially and continued to each other. The system may have only one target 30 shown in FIG. 11, and rotation of the target 30 is not required. The effect of the magnetic-anisotropy enhancement is still the same because a large number of sputter-particles are incident obliquely on the substrate 9 as well as shown in FIG. 9(2).

Though the direction control member 391 is rotated against the stationary substrate 9 in the embodiment shown in FIGS. 1–8, the same effect is obtained by rotating the substrate 9 as the direction control member 391 is stationary. The rotation of each target 30 is not always required. Sometimes deposition is carried out as each target 30 is stationary. In the stationary type deposition, sometimes each target 30 is made face to the substrate 9 by turns by rotating the substrate 9 or the targets 30. This method is preferable in depositing a multilayer film by the targets 30.

The described equal-distance arrangement of the louver boards 392 is not indispensable for this invention. The system of this invention may comprise a direction control member formed with louver boards that are not equally distant or asymmetric. Even the non-equal-distant or asymmetric arrangement does not bring non-uniformity of sputter rate when the louver boards are rotated. The non-equal-distant or asymmetric arrangement of the louver boards is sometimes employed according to distribution characteristics of sputter-particles. Though the direction control member 391 was rotated together with the targets 30 in the described embodiment, it may be rotated separately from the targets 30. This is preferable when the rotation of the direction control member 391 is controlled separately from that of the targets 30.

The described systems as the embodiments were those that carry out the underlying-film deposition and the magnetic-film deposition. This point is not always required for this invention. The system of this invention may be one where deposition of only the underlying film is carried out, or deposition of only the magnetic film is carried out. In the case deposition of only the magnetic film is carried out, the chamber for the deposition comprises the direction control member as described.

Though hard-disks were described as examples of magnetic recording disks, this invention can be applied to manufacture of other magnetic recording disks such as flexible disks and ZIP disks. Moreover, this invention can be applied to manufacture of magnetic recording disks that utilize a function other than magnetism in addition to magnetism, for example magneto-optical (MO) disks. In addition, the concept of this invention can be applied to manufacture of semiconductor devices that utilizes function of magnetism, such as magnetic random access memory (MRAM).

Though this invention enables high magnetic anisotropy without texture formation as described, this invention does not exclude texture formation. When the direction control in the invention is carried out together with texture formation, higher magnetic anisotropy is obtained furthermore. Though the direction control member that provides the passages not closed but open in their cross section has the described advantage, this invention does not exclude any system comprising a direction control member that provides passages or a passage closed in the cross section.

What is claimed is:

1. A system for depositing a magnetic film or depositing an underlying film, comprising:
   a chamber in which the film is deposited onto a substrate by sputtering;
   a target that is provided in the chamber and made of material of the film to be deposited;
   a sputter power source that applies voltage to the target for the sputtering;
   a direction control member that controls sputter-particles released from the target during the sputtering; and
   a rotation mechanism that rotates the direction control member relatively against the substrate,
   wherein the direction control member is provided between the substrate and the target;
   the direction control member provides a passage for the sputter-particles;
   the direction control member lets the sputter-particles selectively pass through, thereby allowing magnetic anisotropy to the magnetic film;
   the target is provided coaxially to the substrate;
   the target is ring-shaped and has a center opening coaxial to the substrate;
   the direction control member is formed with a plurality of louver boards lengthened radially; and
   width direction of each louver board is perpendicular to the substrate.

2. The system according to claim 1, wherein the louver boards are provided at equal angles of 60 degrees or smaller than 60 degrees.

3. The system according to claim 1, wherein the rotation speed of the direction control member is in the range of 6 rpm to 1200 rpm.

4. The system according to claim 1, wherein the target comprises a CoCrTa alloy.

5. A system for depositing a magnetic film or depositing an underlying film, comprising:
   a chamber in which the film is deposited onto a substrate by sputtering;
   a target that is provided in the chamber and made of material of the film to be deposited;
   a sputter power source that applies voltage to the target for the sputtering;
   a direction control member that controls sputter-particles released from the target during the sputtering; and
   a rotation mechanism that rotates the direction control member relatively against the substrate,
   wherein the direction control member is provided between the substrate and the target;
   the direction control member provides a passage for the sputter-particles;

the direction control member lets the sputter-particles selectively pass through, thereby allowing magnetic anisotropy to the magnetic film;

the target is provided coaxially to the substrate;

the target is ring-shaped and has a center opening coaxial to the substrate;

the direction control member is formed with a plurality of louver boards lengthened radially; and the louver boards are provided obliquely to the axis of the substrate, being inclined at equal angles.

6. The system according to claim 5, wherein the rotation speed of the direction control member is in the range of 6 rpm to 1200 rpm.

7. The system according to claim 5, wherein the target comprises a CoCrTa alloy.

8. A method for depositing a magnetic film or depositing an underlying film comprising:

depositing a film onto a substrate by sputtering in a chamber;

providing in the chamber a target made of a material of the film to be deposited;

applying a voltage to the target for the sputtering;

controlling sputter-particles released from the target during the sputtering with a direction control member; and rotating the direction control member relatively against the substrate with a rotation mechanism, wherein the direction control member is provided between the substrate and the target;

the direction control member provides a passage for the sputter-particles;

the direction control member lets the sputter-particles selectively pass through, thereby allowing magnetic anisotropy to the magnetic film;

the target is provided coaxially to the substrate;

the target is ring-shaped and has a center opening coaxial to the substrate;

the direction control member is formed with a plurality of louver boards lengthened radially; and width direction of each louver board is perpendicular to the substrate.

9. The method according to claim 8, wherein the louver boards are provided at equal angles of 60 degrees or smaller than 60 degrees.

10. The method according to claim 8, wherein the rotation speed of the direction control member is in the range of 6 rpm to 1200 rpm.

11. The method according to claim 8, wherein the target comprises a CoCrTa alloy.

* * * * *